(12) United States Patent
Sato

(10) Patent No.: US 6,218,681 B1
(45) Date of Patent: Apr. 17, 2001

(54) GALLIUM ARSENIDE PHOSPHIDE EPITAXIAL WAFER AND LIGHT EMITTING DIODE

(75) Inventor: Tadashige Sato, Ibaraki (JP)

(73) Assignee: Mitsubishi Chemical Corporation, Tokyo (JP)

(*) Notice: Subject to any disclaimer, the term of this patent is extended or adjusted under 35 U.S.C. 154(b) by 0 days.

(21) Appl. No.: 09/220,446

(22) Filed: Dec. 24, 1998

(30) Foreign Application Priority Data

Dec. 24, 1997 (JP) .................................. 9-354774

(51) Int. Cl.$^7$ .................. H01L 27/15; H01L 31/0328
(52) U.S. Cl. ................ 257/86; 257/87; 257/190; 257/191
(58) Field of Search ................... 257/86, 87, 103, 257/190, 191

(56) References Cited

U.S. PATENT DOCUMENTS

| 3,636,618 | * | 1/1972 | Herzog et al. | 257/87 |
| 4,001,056 | * | 1/1977 | Groves et al. | 257/87 |
| 4,218,270 | * | 8/1980 | Hasegawa et al. | 257/87 |
| 5,751,026 | * | 5/1998 | Sato et al. | 257/87 |

* cited by examiner

Primary Examiner—Minh Loan Tran
(74) Attorney, Agent, or Firm—Oblon, Spivak, McClelland, Maier & Neustadt, P.C.

(57) ABSTRACT

The present invention provides an epitaxial wafer having compound semiconductor epitaxial layer provided on a substrate, a total thickness of a portion of the compound semiconductor epitaxial layers comprises Ga, As and P as constituent elements being not less than 80 $\mu$m and in the epitaxial layer a low carrier concentration region with a carrier concentration of from 0.5 to $9 \times 10^{15}$ cm$^{-3}$ doped with nitrogen being formed.

25 Claims, 3 Drawing Sheets

GALLIUM ARSENIDE PHOSPHIDE EPITAXIAL WAFER AND LIGHT EMITTING DIODE

FIELD OF THE INVENTION

The present invention relates to a gallium arsenide phosphide epitaxial wafer and a light emitting diode (hereinafter referred as "LED") comprising the epitaxial wafer.

BACKGROUND OF THE INVENTION

LED devices made of semiconductor crystal are widely used as display elements. These LED devices are mostly made of II–V compound semiconductors. III–V compound Semiconductors have a band gap corresponding to the wavelength of visible light and infrared light and thus have been applied to light emitting elements. Among these III–V compound semiconductors, GaAsP has been in great demand as an LED. Since the most important characteristics of GaAsP LED devices are light emitting power and life, improvements in these characteristics have been desired.

$GaAs_{1-x}P_x$ (0.45<x<1) is doped with nitrogen (N) as an isoelectronic trap to thereby enhance light emitting efficiency. This LED device exhibits a light output enhanced about 10 times. In general, this LED device can be stably obtained by a process which comprises vapor phase epitaxial growth of N-type layers using a quartz reactor, and then diffusion of zinc from the surface of a light emitting layer to form a P-type layer therein, thereby forming a PN-junction.

FIG. 4 illustrates a general structure of a GaAsP epitaxial wafer.

In FIG. 4, the GaAsP epitaxial wafer is made of a GaP single crystal substrate 1, on which a homo-layer 2 having the same composition as that of the substrate 1, a $GaAs_{1-x}P_x$ graded composition layer 3 having a composition continuously changing from 1.0 to $x_0$ to relax the lattice mismatch between the substrate and the uppermost layer, a $GaAs_{1-x0}P_{x0}$ constant composition layer 4, and a $GaAs_{1-x0}P_{x0}$ N-doped layer 5 doped with nitrogen are formed in this order. The uppermost layer of the epitaxial wafer is a light-emitting layer having a constant composition $x_0$, which is arranged to obtain the desired emission wavelength of the LED. This light emitting layer has been doped with nitrogen and tellurium (Te) or sulfur (S) in such an amount that a predetermined carrier concentration is realized. Usually, the composition $x_0$ is about 0.65 for emission of red light (wavelength: 630 nm). Nitrogen acts as an isoelectronic trap which serves as a light emitting center. However, nitrogen is electrically inactive and thus does not contribute to the carrier concentration.

In order to put this LED material into practical use as an LED device, it is necessary that the electrical characteristics of this LED material be improved. JP-A-53-64488 (The term "JP-A" used herein means an "unexamined published Japanese patent application") discloses a structure having a carrier concentration gradient in which the carrier concentration is from 1 to $20\times10^{16}$ only in the portion that serves as a light emitting layer, and but not less than $10\times10^{16}$ in the other epitaxial layers. The above-cited patent describes that the thickness of the GaAsP epitaxial layer in its attached drawings is 100 $\mu$m at one end of the wafer and 230 $\mu$m at the other.

It is also known that the carrier concentration should be from 3.5 to $8.8\times10^{15}$ cm$^{-3}$ to minimize the destruction of the completeness in crystallinity of the light emitting layer during the formation of the PN-junction by the diffusion of zinc from in the surface of the light emitting layer. This prolongs the life of carriers thus injected, resulting in an LED device having a high light output (JP-A-55-9467). It is further known that when the carrier concentration of the light emitting layer is further reduced to not more than $3\times10^{15}$ cm$^{-3}$, the enhancement of light output and the prolongation of LED life can be realized at the same time as shown in FIGS. 5 and 6. It is further known that the layers other than the light emitting layer are droped with Te or S to a carrier concentration as high as from 0.5 to $5\times10^{17}$ cm$^{-3}$, to thereby reduce the electrical resistance of the LED (JP-A-6-196756).

SUMMARY OF THE INVENTION

In recent years, as the applications of LEDs have diversified, LEDs having an extremely high reliability have come to be in great demand.

Past studies show that the optimization of the carrier concentration profile of the epitaxial layer makes it possible to prolong LED life. However, the further prolongation of LED life is limited if only the optimization of the carrier concentration of the epitaxial wafer is effected.

In other words, a structure having two ranges of carrier concentration, as described in JP-A-53-64488, is effective for the improvement of the electrical characteristics of an LED. However, the carrier concentration in the low carrier concentration layer which serves as a light-emitting layer, is from 1 to $20\times10^{16}$ cm$^{-3}$. this structure cannot realize the prolongation of life and the enhancement of brightness to an extent which has been desired so far as can be seen in JP-A-6-196756 and JP-A-55-9467. Further, as described in JP-A-6-196756, a structure having two ranges of carrier concentration, wherein the carrier concentration in the higher carrier concentration layer is as high as from 0.5 to $5\times10^{17}$ cm$^{-3}$, provides some improvement in life and light output. However, this improvement falls short of the desired level.

The inventors made extensive studies in the development of a solution to the foregoing problems. As a result, it was found that the optimization of the carrier concentration in specific layers and the restruction of the thickness of othe entire $GaAs_{1-x}P_x$ (0<x<1) epitaxial layer to not less than 80 $\mu$m had a good effect on the internal stress applied to the PN-junction, making it possible to drastically prolong the life of the light emitting diode. Thus, the present invention has been developed.

An essence of the present invention lies in an epitaxial wafer having compound semiconductor epitaxial layers provided on a substrate a total thickness of the portion of the epitaxial layers that comprises Ga, As and P as constituent elements being not less than 80 $\mu$m and in the epitaxial layer a low carrier concentration region with a carrier concentration of from 0.5 to $9\times10^{15}$ cm$^{-3}$ doped with nitrogen being formed. Another essence of the present invention is a light emitting diode produced from such an epitaxial wafer.

In the epitaxial wafer according to the present invention, the compound semiconductor eptiaxial layer comprising Ga, As and P as constituent elements preferably has a thickness of not more than 200 $\mu$m.

The foregoing low carrier concentration region preferably has a thickness of not less than 2 $\mu$m.

The low carrier concentration region preferably has a thickness of not more than 80 $\mu$m.

The compound semiconductor epitaxial layer comprising Ga, As and P as constituent elements preferably has an in-(wafer surface-)plane thickness difference of not more than 120 $\mu$m.

The compound semiconductor epitaxial layer comprising Ga, As and P as constituent elements preferably has an average carrier concentration of from 0.5 to $5\times10^{17}$ cm$^{-3}$ in the region other than the low carrier concentration region.

The compound semiconductor epitaxial layer comprising Ga, As and P as constituent elements preferably is a GaAs$_{1-x}$P$_x$ (0<x<1) epitaxial layer wherein the GaAs$_{1-x}$P$_x$ epitaxial layer preferably has a composition x from greater than 0.45 to less than 1.

The compound semiconductor epitaxial layer comprising Ga, As and P as constituent elements preferably comprises a graded composition layer and a constant composition layer in which the low carrier concentration region lies, wherein the GaP composition x in the graded composition layer is preferably from greater than 0.45 to less than 1, and the GaP composition $x_0$ in the constant composition layer is preferably from greater than 0.45 to 0.95 or less.

The foregoing substrate is preferably a single crystal, more preferably GaAs single crystal or GaP single crystal.

A homo-layer, which is an epitaxial layer having the same composition as the substrate, is preferably provided interposed between the compound semiconductor epitaxial layer made of Ga, As and P as constituent elements and the substrate.

The low carrier concentration region preferably has a PN-junction provided therein.

The conduction type of the compound semiconductor epitaxial layer comprising Ga, As and P as constituent elements is preferably N type. In this case, a P-type dopant is preferably diffused in such an epitaxial wafer, wherein the thickness of the low carrier concentration region is not less than 10 µm over the region ranging from the surface of the epitaxial layer to the low carrier concentration region, to form a PN-junction in the low carrier concentration region. Alternatively, a constant composition layer, the conduction type of which is P, is preferably allowed to undergo vapor growth on the low carrier concentration region.

The epitaxial wafer according to the present invention is preferably adapted for light emitting diodes.

BRIEF DESCRIPTION OF THE DRAWINGS

By way of example and to make the description more clear, reference is made to the accompanying drawings in which.

DETAILED DESCRIPTION OF THE INVENTION

Figure 2:
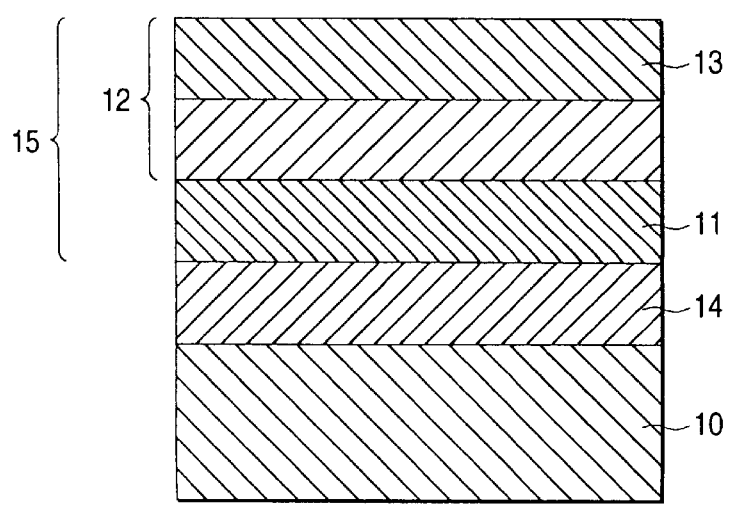
FIG. 2 is a sectional view of the structure of a gallium arsenide phosphide epitaxial wafer according to the present invention.

The present invention will be further described in connection with FIG. 2, which illustrates an embodiment of a layered structure of the epitaxial wafer according to the present invention.

As the substrate 10 there may be used any material on which a compound semiconductor epitaxial layer made of Ga, As and P as constituent elements (i.e., GaAs$_{1-x}$P$_x$ (0<x<1) epitaxial layer 15) can grow. It is preferable that the total amount of element other than Ga, As and P in the substrate, is less than the amount of dopant in the compound semiconductor epitaxial layer. In practice, any of substrates of a single crystal, particularly GaP or GaAs, may be used. A GaP single crystal substrate is preferably used taking into account lattice matching and the crystallinity of the layer that is allowed to grow on the substrate. A GaP single crystal substrate is transparent to light emitted by a GaAs$_{1-x0}$P$_{x0}$ (0.45<$x_0$≦0.95) constant composition layer 12, and thus is desirable to provide an LED device having a high light output. The carrier concentration in the substrate is from 0.5 to $30\times10^{17}$ cm$^{-3}$, and preferably from 2 to $10\times10^{17}$ cm$^{-3}$.

The homo-layer 14 having the same composition as the substrate 10 doesn't necessarily need to be formed interposed between the substrate 10 and the GaAsP epitaxial layer 15. In order to reduce misfit dislocation, it is preferable that the homo-layer 14 be formed to a thickness of from 0.1 to 100 µm, and more preferably from 0.5 to 20 µm, to invariably provide a high brightness. The homo-layer has the same composition as the substrate and thus has little or no effect on the internal stress to be described later. The carrier concentration of the homo-layer 14 is preferably almost the same as that of the graded composition layer 11 which has just begun to grow.

The GaAs$_{1-x}$P$_x$ (0<x<1, preferably 0.45<x<1) epitaxial layer 15 normally comprises the GaAs$_{1-x}$P$_x$ (0.45<x<1) graded composition layer 11 and the GaAs$_{1-x0}$P$_{x0}$ (0.45<$x_0$≦0.95) constant composition layer 12.

The graded composition layer 11 is a layer formed on the substrate 10 or the homo-layer 14 having the same composition as the substrate 10 which changes in composition continuously or stepwise from that of the substrate 10 or the homo-layer 14 to that of the starting point of the constant composition layer 12. The graded composition layer 11 is adapted to reduce misfit dislocation in the constant composition layer due to the difference in lattice constant between the substrate 10 and the constant composition layer 12, thereby obtaining a good quality constant composition layer having little crystal defect.

The constant composition layer 12 is a layer having a constant composition. The composition of the constant composition layer 12 is preferably as constant as possible. The GaP composition $x_0$ of the GaAs$_{1-x0}$P$_{x0}$ constant composition layer preferably deviates within the range of ±0.05 from the average of x over the entire constant composition layer 12. This inhibit crystal defects such as misfit dislocation, regardless of whether the composition X changes continuously or stepwise. More preferably, the change in the GaP composition x is within ±0.02 to invariably obtain an LED device having a high light output.

In general, the $x_0$ of the constant composition layer 12 preferably corresponds to that of the composition for desired wavelength of emitted light (about 0.9 for the emission of yellow light having a wavelength of 590 nm, 0.65 for the emission of red light having a wavelength of 630 nm, 0.55 for the emission of red light having a wavelength range of not less than 650 nm). The graded composition layer 11 preferably has a composition having a composition x, which lowers from 1 to $x_0$ at a constant ratio over the region ranging from the interface with the GaP substrate 10 or GaP homo-layer 14 to the interface with the gaAs$_{1-x}$P$_{x0}$ (0.45<x$_0$±0.95) constant composition layer 12. However, the present invention is not limited to such an arrangement.

The graded composition layer 11 normally has a thickness of from 15 to 150 μm, and preferably from 20 to 90 μm. The graded composition layer 11, whether its composition changes continuously or stepwise, has the same effect because the specific resistivity of the epitaxial layer 15 is determined mainly by carrier concentration.

The constant composition layer 12 normally has a thickness of from 10 to 120 μm, and preferably from 20 to 90 μm, in order to minimize the effect of crystal defects such as misfit dislocation occurring in the graded composition layer 11, thereby obtaining a carrier concentration region having a better crystallinity. The constant composition layer 12 is preferably free of internal composition change to provide a high brightness easily. In practice, however, a composition difference of not more than 0.05 as calculated in terms of a composition is acceptable.

The thickness of the GaAs$_{1-x}$P$_x$ (0<x<1) epitaxial layer comprising the graded composition layer 11 and the constant composition layer 12 is normally not less than 80 μm, and preferably not less than 100 μm. In practice, the specific resistivity of the GaAsP is higher than that of the substrate. Therefore, as the thickness of the GaAsP layer increases, the forward voltage of the LED increases. In this respect, the thickness of the GaAs$_{1-x}$P$_x$ (0<x<1) epitaxial layer is preferably not more than 200 μm, and more preferably not more than 150 μm.

The low carrier concentration region 13 is normally formed in the constant composition layer. The low carrier concentration region 13 normally has a carrier concentration of from 0.5 to 9×10$^{15}$ cm$^{-3}$. If the carrier concentration in the low carrier concentration region 13 falls below 0.5×10$^{15}$ cm$^{-3}$, it provides hard control over the carrier concentration or gives an enhanced specific resistivity that causes a rise in the forward voltage of the LED. If the carrier concentration in the low carrier concentration region 13 ranges from 0.5 to 3×10$^{15}$ cm$^{-3}$, prolonged life and higher brightness can be advantageously provided. If this epitaxial wafer is adapted for a light emitting diode, the GaAs$_{1-x}$P$_x$ (0<x<1) epitaxial layer 15 is formed in most cases by a process which comprises vapor phase epitaxial growth of N-type layers, and then diffusion of P-type dopant such as zinc into the layer from the surface thereof to form a PN-junction in the low carrier concentration region. Alternatively, the epitaxial layer 15 may be formed by, a process which comprises vapor phase epitaxial growth of a P-type constant composition layer, on the low carrier concentrtion region to form a PN-junction. In the case of the former process, it is necessary that the P-type dopant such as zinc be diffused into the layer to a thickness of from 4 to 15 μm. Thus, the thickness of the low carrier concentration region is preferably not less than 10 μm. In the case of the latter process, the thickness of the low carrier concentration region may be not less than 2 μm. If the thickness of the low carrier concentration region 13 is too great, it causes a rise in the forward voltage of the LED. Therefore, the thickness of the low carrier concentration region 13 is preferably not more than 80 μm, and more preferably not more than 50 μm.

If a p-type layer is allowed to undergo vapor growth, it is usual that the mixing ratio of the p-type layer is almost the same as that of the constant composition layer 12.

It is usual that the carrier concentration in the GaAs$_{1-x}$P$_x$ (0<x<1) epitaxial layer 15 in the region other than the low carrier concentration region, which serves as a light emitting layer, is from not less than 0.5×10$^{17}$ cm$^{-3}$, and preferably not less than 1×10$^{17}$ cm$^{-3}$, to not more than 30×10$^{17}$ cm$^{-3}$, and preferably not more than 5×10$^{17}$ cm$^{-3}$, to reduce the resistance of the resulting LED. If the carrier concentration falls below the above-defined lower limit, increase of the forward voltage of the LED is caused. On the contrary, if the carrier concentration exceeds the above defined upper limit, crystal defects occur more frequently with the rise in the carrier concentration, possibly causing the deterioration in quality of epitaxial wafer and light output of the LED due to absorption of light.

For this measurement of the carrier concentration in the epitaxial layer, the epitaxial layer is polished slantly on the surface thereof. A Schottky barrier diode is then produced on the surface of the epitaxial layer. In this arrangement, the carrier concentration in the epitaxial layer is measured by a C-V process. The measurement of the carrier concentration in the epitaxial layer can be similarly carried out by a process which comprises measuring, while directly etching the epitaxial layer with an electrolyte using a semiconductor profile plotter produced by Polaron Inc. of England.

Even if the epitaxial wafer is produced by an organic metal vapor growth process (MOCVD), the same effect as mentioned above can be exerted. However, a halogen transport process, particularly a hidride process, is most effective from the standpoint of productivity and practicability.

The mechanism of the effect of enhancement of life exerted by restricting the thickness of the GaAs$_{1-x}$P$_x$ (0<x<1) epitaxial layer 15 (refer to FIG. 4) to not less than 80 μm in the present invention is unknown but can be thought as follows. In the scope of the present invention, the epitaxial layer corresponds to the upper epitaxial layer, which is disposed at an upper position relative to a layer of different composition what is initially formed on the substrate. Therefore the homo-layer 14 is not included in the epitaxial layer defined in the scope of the present invention. GaAsP is allowed to undergo epitaxial growth on the GaP single crystal substrate. However, these materials have different coefficients of thermal expansion. Since epitaxial growth normally occurs at a high temperature, the resulting epitaxial wafer bends as it cools. As a matter of course, an internal stress occurs in the epitaxial layer. The internal stress distorts the crystal, causing the occurrence of crystal defects or causing various adverse effects on the performance of the LED device. In particular, if the stress in the PN-junction is great, it causes deterioration of the LED. The reduction of the internal stress cannot be accomplished by lowering the growth temperature to room temperature. Further, a GaAsP substrate having the same coefficient of thermal expansion as that of the GaP single crystal substrate cannot be actually obtained.

The inventors found that the inhibition of deterioration by internal stress in the epitaxial layer can be accomplished by the optimization of the total thickness of the epitaxial layer based on theoretical calculation. It was further found that combined with the optimization of the carrier concentration in the epitaxial layer based on the past knowledge, the foregoing optimization of the total thickness of the epitaxial layer can prolong the life of the LED.

It is important that the internal stress in the PN-junction be small. The internal stress, if any, doesn't occur homogeneously throughout the epitaxial layer but is widely distributed in the epitaxial layer. Accordingly, it can be thought that if the structure of the epitaxial wafer can be designed taking into account the distribution of stress, the internal stress in the PN-junction can be reduced.

With respect to the measurement point 3 shown in Table 1 below, coefficient of thermal expansion Young's ratio and Poisson's ratio are obtained corresponding to the composition and thickness of each epitaxitial layer. Internal stress is calculated based on these parameters. Also, internal stresses of epitaxial wafers having total thickness of GaAsP layers of 30 $\mu$m and 120 $\mu$m are calculated. In this calculation, thickness of each GaAsP epitaxial layer is figured out in proportion to total thickness of GaAsP epitaxial layers.

From the theory of the thermo dynamics on beam, the sum of the moment of tensile stress and compression stress, caused by the difference between the growth temperature and room temperature, can be calculated to be 0, assuming that the epitaxial layer is a laminate of a plurality of circular plates having different coefficients of thermal expansion. For this calculation, the coefficients of thermal expansion of GaAs and GaP were given a linear correction by a composition to determine the coefficient of thermal expansion of the mixed crystal.

Figure 3:
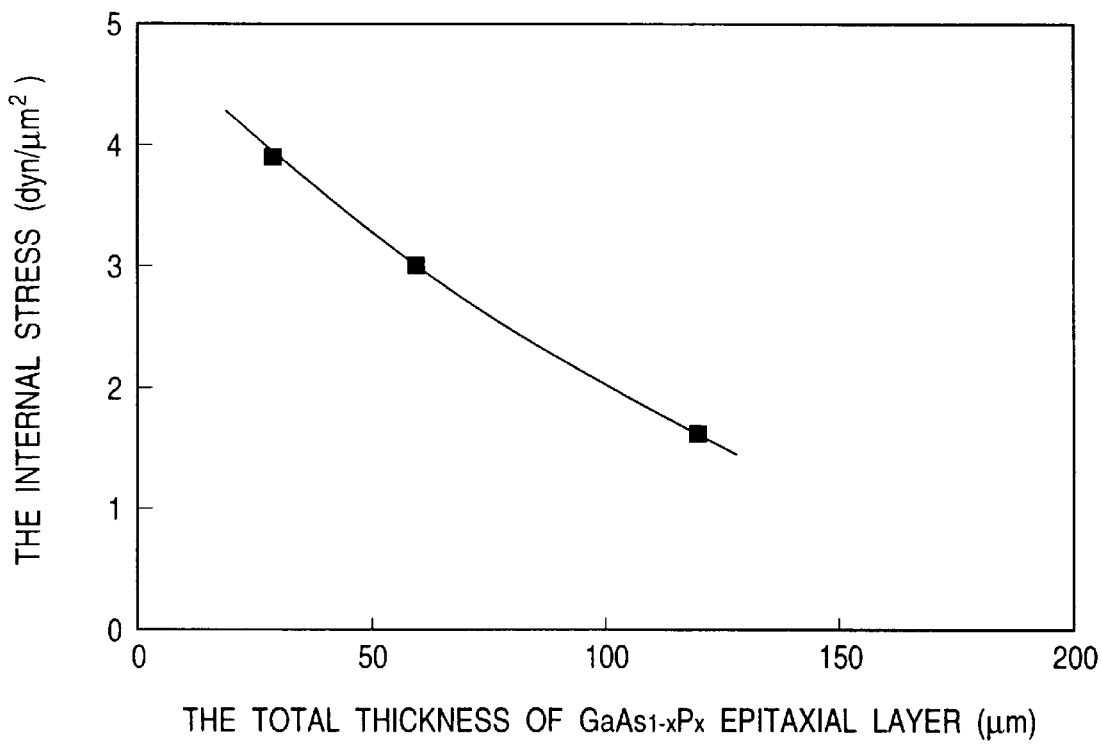
FIG. 3 is a graph illustrating the relationship between the total thickness of a GaAs$_{1-x}$P$_x$ (0<x<1) epitaxial layer and the theoretically calculated internal stress in a PN-junction.

FIG. 3 illustrates the distribution of internal stress with different layer thicknesses. If the thickness of the epitaxial layer is great, it can be usually thought that the epitaxial wafer warps much, giving a great internal stress. However, as shown in FIG. 3, the internal stress increases in the epitaxial layer but decreases in the surface of the epitaxial layer where a PN-junction is formed. This is attributed to the distribution of composition in the graded composition layer and the constant composition layer. The structure comprising these layers in combination is essentially useful for the reduction of stress in the surface of the epitaxial layer. The homo-layer is the same as the GaP substrate. Thus, the homo-layer cannot exert great effect. It can be accordingly thought that the total thickness of the graded composition layer as the GaAsP layer and the constant composition layer is preferably from about 80 $\mu$m to 150 $\mu$m.

An actual epitaxial wafer was examined for the actual relationship between the total thickness of the GaAsP layer and the life of the LED as compared with the theoretical value. As a result, the life of the LED was drastically improved when the total thickness of the GaAsP layer was not less than about 80 $\mu$m. The heat generation by the passage of current through the GaAsP layer increases when the thickness of the GaAsP layer is not less than 80 $\mu$m. However, if the thickness of the entire GaAsP layer is great, it can have a great effect in reducing the propagation dislocation from the GaP substrate and hence the dislocation density in the light emitting layer, while having little or no adverse effect on the life of the LED.

The thickness of the GaAsP layer is preferably not less than 80 $\mu$m anywhere on the surface of the wafer, and more preferably over the entire surface of the wafer. Similarly, the upper limit of the thickness (i.e., 200 $\mu$m, and preferably 150 $\mu$m) is preferably realized anywhere on the surface of the wafer, and more preferably over the entire surface of the wafer. Further, the difference in the thickness of the GaAsP layer over the surface of the wafer is not more than 120 $\mu$m, and preferably not more than 100 $\mu$m.

The present invention will be further described in the following examples, but the present invention should not be construed as being limited thereto.

EXAMPLES AND COMPARATIVE EXAMPLES

Figure 4:
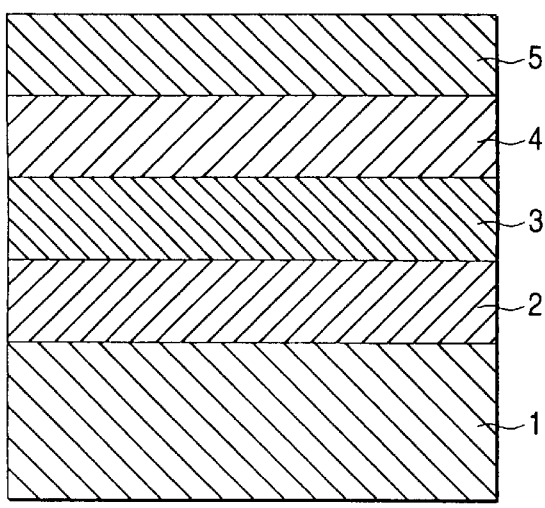
FIG. 4 is a sectional view of the structure of a general gallium arsenide phosphide epitaxial wafer.
Figure 5:
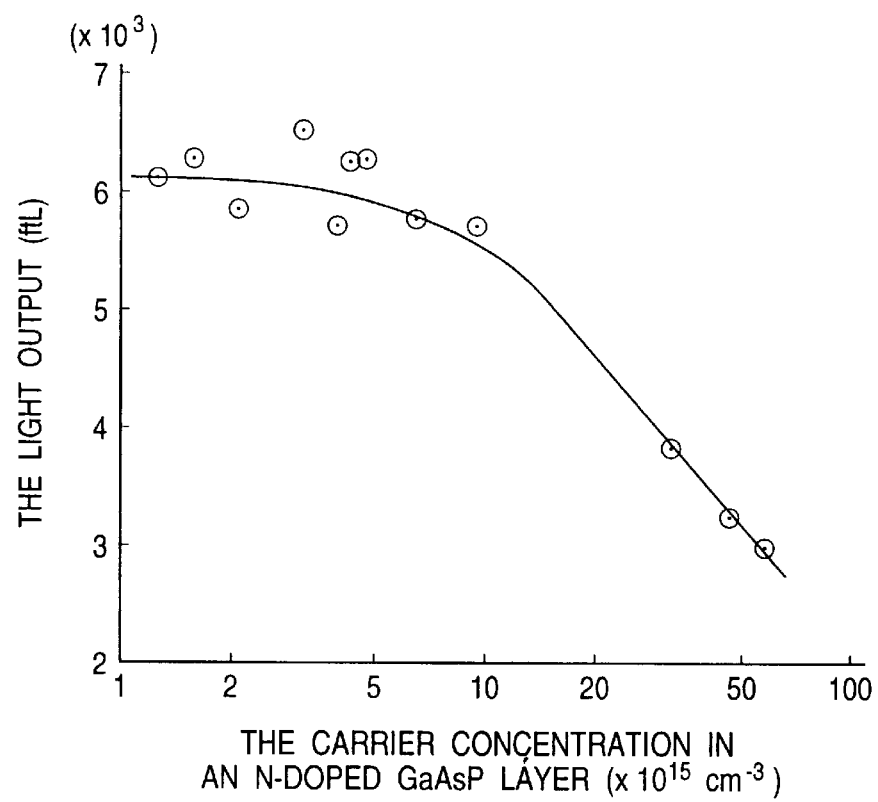
FIG. 5 is a graph illustrating the relationship between the carrier concentration in an N-doped GaAsP layer and the light output of an LED.
Figure 6:
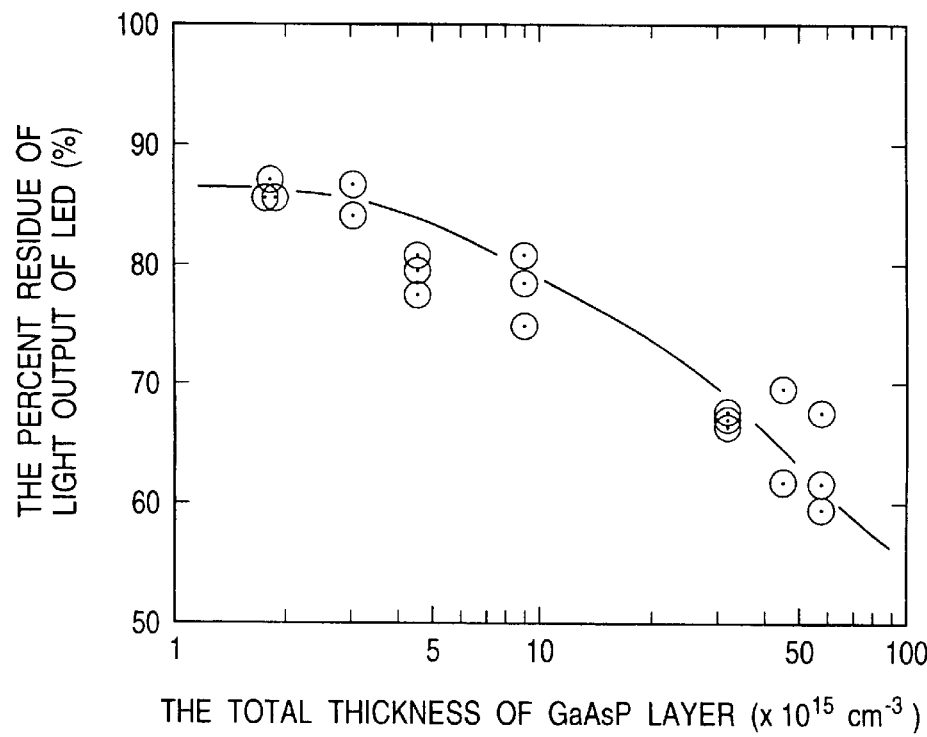
FIG. 6 is a graph illustrating the relationship between the percent residue of light output of an LED after energization for life test and the total thickness of a GaAsP layer.

An epitaxial wafer comprising a GaP homo-layer 2, a GaAs$_{1-x}$P$_x$ (x=1 to 0.35) graded composition layer 3, a GaAs$_{0.35}$P$_{0.65}$ constant composition layer 4 and a GaAs$_{0.35}$P$_{0.65}$ N-doped layer 5 provided on a GaP substrate 1 as shown in FIG. 4 was allowed to grow by the following process.

As the gas composition for epitaxial growth there was used an AsH$_3$-PH$_3$-HCl-Ga-H$_2$ system. In other words, a so-called hydride transport process was employed. A GaP substrate and high purity gallium (Ga) were respectively placed on predetermined points in an epitaxial reactor with a quartz boat for a Ga reservoir. As the GaP substrate there was used a circular GaP substrate having a diameter of about 50 mm and a plane orientation (100) 6° off foward [01–1] which had been doped with sulfur (S) in an amount of from 3 to 10×10$^{17}$ atom/cm$^3$ (carrier concentration: 2 to 10×10$^{17}$ cm$^{-3}$).

Using the quartz reactor, the vapor phase epitaxial growth of a gallium arsonide phosphide (GaAs$_{1-x}$P$_x$ (x=0.65)) epitaxial wafer for a red light emitting diode having a peak emission wavelength of 630 nm±3 nm began. An n-type dopant gas (diethyltellurium (C$_2$H$_5$)$_2$Te)) was then supplied into the reactor so that the carrier concentration ranged from 1 to 5×10$^{17}$ cm$^{-3}$ over the region ranging from the layer 2 to the layer 4. Ammonia (NH$_3$) was also supplied into the reactor so that the layer 5 was doped with nitrogen to a carrier concentration of from 1 to 4×10$^{15}$ cm$^{-3}$.

In the epitaxial growth process, Ga and GaP were placed in the reactor. The operation proceeded to a heat rising process where epitaxial growth occurred with hydrogen (H$_2$) being introduced as a carrier gas. As a dopant there was used diethyltellurium (diethyltellurium (C$_2$H$_5$)$_2$Te)), which is an n-type impurity. As a nitrogen dopant there was used ammonia (NH$_3$). Ga was supplied in the form of GaCl obtained by the reaction of Ga with hydrochloric acid (HCl) gas. Diethyltellurium was introduced into the reactor so that the carrier concentration was not less than from 1 to 3×10$^{17}$ cm$^{-3}$, 5×10$^{17}$ cm$^{-3}$ on the average. In the initial stage, GaCl gas and phosphine (PH$_3$) gas were introduced into the reactor. The amount of arsine (AsH$_3$) gas introduced into the reactor was then gradually increased. In this manner, epitaxial process was effected while determining the structure of the epitaxial layer by the ratio of PH$_3$ and AsH$_3$ thus introduced. In the final 50-minute stage, gas introduction was effected so that the carrier concentration reached 3 to 5×10$^{15}$ cm$^{-3}$. At the same time, ammonia was introduced into the reactor so that the GaAsP layer 5 was doped with nitrogen. In the initial stage of growing the homo-layer 2, the substrate temperature was set to 940° C., the substrate temperature was gradually decreased up to 850° C. in the stage of growing the graded composition layer, and then in the stage of growing the constant composition layer, the substrate temperature is remained at 850° C.

For the measurement of the carrier concentration in the nitrogen-doped constant composition layer 5, which serves as a light emitting diode, a Schottky barrier diode was produced on the surface of the epitaxial wafer which had not yet been subjected to diffusion. A C-V process was then employed for the measurement of carrier concentration. As a result, the nitrogen-doped constant composition layer 5 showed a carrier concentration of from 3 to 5×10$^{15}$ cm$^{-3}$. For the measurement of the carrier concentration in the other layers, the GaAsP layer was removed slantly at an angle of about 1° to the surface thereof by lapping and etching. A Schottky barrier diode was then produced on the exposed surface of the GaAsP layer. A C-V process was then similarly employed.

Subsequently, the epitaxial wafer which had thus grown was enclosed uncoated in a quartz ample together with ZnP$_2$ which supplies Zn as a P-type impurity to be diffused. The air in the quartz was then evacuated. In this arrangement, Zn was then diffused into the epitaxial wafer to a depth of 4 $\mu$m at a temperature of 760° C. The epitaxial wafer was then measured for light output using a grooving method. Subsequently, the epitaxial wafer was subjected to vacuum evaporation to form an electrode thereon. Thus, by dicing the epitaxial wafer a mesa shaped light emitting diode having a diameter of 220 μm and a thickness of 180 μm was produced. The light emitting diode thus produced was then subjected to an aging test. Referring to the operating conditions, the LED chip was mounted on a TO-18 header. A 100 Hz pulse with duty of ½ was then applied to the specimen at a current density of 240 A/cm$^2$ at room temperature for 168 hours.

Figure 1:
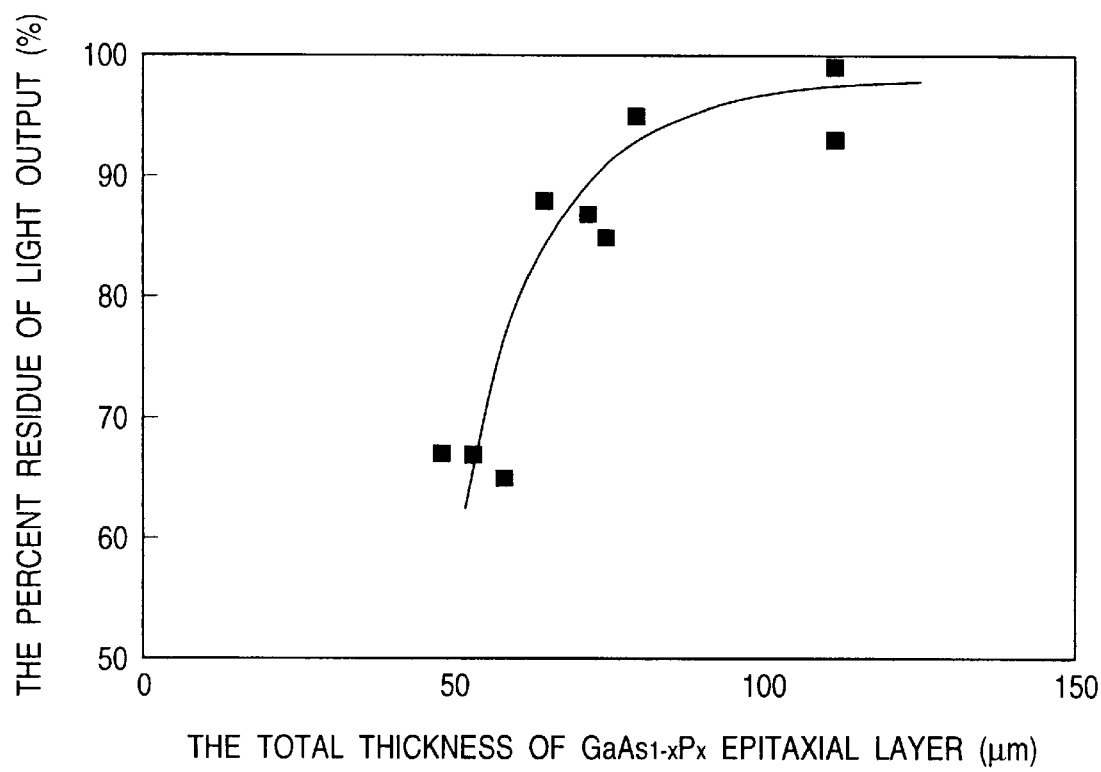
FIG. 1 is a graph illustrating the relationship between the percent residue of light output of an LED produced from an epitaxial wafer according to the present invention after energization for a life test and the total thickness of GaAs$_{1-x}$P$_x$ (0<x<1) epitaxial layer.

Table 1 and FIG. 1 illustrate the relationship between the percent residue of light output from the LED after aging test and the total thickness of the $GaAs_{1-x}P_x$ (0<x<1) epitaxial layer. These LED's showed drastic enhancement of life when the total thickness of $GaAs_{1-x}P_x$ (0<x<1) epitaxial layer is not less than 80 μm. The percent residue of light output was settled to about 95% when the total thickness of the $GaAs_{1-x}P_x$ (0<x<1) epitaxial layer was 100 μm. The difference in the total thickness of the $GaAs_{1-x}P_x$ (0<x<1) epitaxial layer on the surface of the epitaxial wafer was not more than 70 μm.

TABLE 1

| | Points of measurement | | | | | | | | |
|---|---|---|---|---|---|---|---|---|---|
| | 1 | 2 | 3 | 4 | 5 | 6 | 7 | 8 | 9 |
| % Residue of light output | 67 | 67 | 65 | 88 | 87 | 85 | 95 | 93 | 99 |
| Carrier concentration of Layer 5 (× 10$^{15}$ cm$^{-3}$) | 3.0 | 3.4 | 3.5 | 3.3 | 3.5 | 3.7 | 3.9 | 3.8 | 4.0 |
| Carrier concentration of Layers 3, 4 (× 10$^{17}$ cm$^{-3}$) | | | | 3 to 4 | | | | | |
| Thickness of Layer 5 (μm) | 19 | 20 | 23 | 26 | 29 | 30 | 32 | 45 | 44 |
| Thickness of Layer 4 (μm) | 7 | 8 | 9 | 10 | 11 | 12 | 13 | 17 | 17 |
| Thickness of Layer 3 (μm) | 22 | 25 | 26 | 29 | 32 | 33 | 35 | 50 | 51 |
| Total thickness of Layers 3 to 5 (μm) | 48 | 53 | 58 | 65 | 72 | 75 | 80 | 112 | 112 |

These LED's showed a practically acceptable and good forward voltage even when the thickness of the $GaAs_{1-x}P_x$ (0<x<1) epitaxial layer was 112 μm. Experimentally speaking, when the thickness of the $GaAs_{1-x}P_x$ (0<x<1) epitaxial layer exceeds 150 μm, the LED shows too high a forward voltage that deviates from the standard specification of the LED, and thus makes it impossible for the LED to be put into practical use.

The present examples have been described with reference only to a red light emitting diode (emission wavelength: 630 nm; x=0.65). However, the same effect can be exerted also when these epitaxial wafers are adapted to a yellow light emitting diode (emission wavelength: 590 nm; x=0.9) or a red light emitting diode (emission wavelength: 650 nm (longer than that of yellow light emitting diode); x=0.55).

As mentioned above, in accordance with the present invention, an epitaxial wafer which can realize a high output LED with an extremely prolonged life as a display element can be stably supplied. The LED device thus supplied has an extremely enhanced reliability. Thus, the epitaxial wafer can be expected to find wide application in LEDs, providing a great industrial benefit.

While the invention has been described in detail and with reference to specific embodiments thereof, it will be apparent to one skilled in the art that various changes and modifications can be made therein without departing from the spirit and scope thereof.

What is claimed is:

1. An epitaxial wafer comprising compound semiconductor epitaxial layers provided on a substrate, a total thickness of a portion of said epitaxial layers that comprises Ga, As and P as constituent elements being not less than 80 μm, said portion of said epitaxial layers has a low carrier concentration region with a carrier concentration of from 0.5 to 9×10$^{15}$ cm$^{-3}$ doped with nitrogen being formed therein.

2. The epitaxial wafer according to claim 1, wherein said total thickness of such portion of said compound semiconductor epitaxial layers that comprises Ga, As and P as constituent elements is not more than 200 μm.

3. The wafer as claimed in claim 2, wherein said total thickness is not more than 150 μm.

4. The epitaxial wafer according to claim 1, wherein said low carrier concentration region has a thickness of not less than 2 μm.

5. The epitaxial wafer according to claim 1, wherein said low carrier concentration region has a thickness of not more than 80 μm.

6. The epitaxial wafer according to claim 1, wherein said total thickness of such portion of compound semiconductor epitaxial layers that comprises Ga, As and P as constituent elements has an in-plane difference of not more than 120 μm.

7. The epitaxial wafer according to claim 1, wherein said portion of compound semiconductor epitaxial layers that comprises Ga, As and P as constituent elements has an average carrier concentration of from 0.5 to 5×10$^{17}$ cm$^{-3}$ in the region other than said low carrier concentration region.

8. The wafer as claimed in claim 7, wherein said carrier concentration in said low carrier concentration region is from 0.5 to 3×10$^{15}$ cm$^{-3}$.

9. The wafer as claimed in claim 7, wherein said carrier concentration in said low carrier concentration region is from 0.5 to 5×10$^{15}$ cm$^{-3}$.

10. The epitaxial wafer according to claim 1, wherein said portion of compound semiconductor epitaxial layers that comprises Ga, As and P as constituent elements is a GaAs$_{1-x}$P$_x$ epitaxial layer wherein x is greater than 0 and less than 1.

11. The epitaxial wafer according to claim 10, wherein said composition X of GaAs$_{1-x}$P$_x$ epitaxial layer is a GaP composition x which is greater than 0.45 and less than 1.

12. The wafer as claimed in claim 11, wherein x is 0.9.

13. The epitaxial wafer according to claim 1, wherein said portion of compound semiconductor epitaxial layers that comprises Ga, As and P as constituent elements comprises a graded composition layer and a constant composition layer in which the low carrier concentration region lies.

14. The epitaxial wafer according to claim 13, wherein a compositionn ratio x in the graded composition layer is greater than 0.45 and less than 1 and a GaP composition $x_0$ in the constant composition layer is greater than 0.45 and not greater than 0.95.

15. The epitaxial wafer according to claim 1, wherein the substrate is a single crystal.

16. The epitaxial wafer according to claim 15, wherein the substrate is selected from the group consisting of GaAs single crystal and GaP single crystal.

17. The epitaxial wafer according to claim 15, wherein a homo-layer which is an epitaxial layer having the same composition as the substrate is provided interposed between the compound semiconductor epitaxial layers comprising Ga, As and P as constituent elements and the substrate.

18. The epitaxial wafer according to claim 1, wherein the low carrier concentration region has a PN-junction provided therein.

19. The epitaxial wafer according to claim 1, wherein the conduction type of the compound semiconductor epitaxial layer comprising Ga, As and P as constituent elements is N-type.

20. The epitaxial wafer according to claim 19, wherein a P-type dopant is diffused in such an epitaxial wafer wherein the thickness of the low carrier concentration region is not less than 10 μm over the region ranging from the surface of the epitaxial layers to the low carrier concentration region to form a PN-junction in the low carrier concentration region.

21. The epitaxial wafer according to claim 19, wherein a P-type constant composition layer is provided on said low carrier concentration region by vapor phase epitaxial growth.

22. The epitaxial wafer according to claim 1, which is used for light emitting diode.

23. A light emitting diode formed by using the epitaxial wafer according to claim 1.

24. The wafer as claimed in claim 1, wherein said carrier concentration is from 0.5 to 3×10$^{15}$ cm$^{-3}$.

25. The wafer as claimed in claim 1, wherein said carrier concentration is from 3 to 5×10$^{15}$ cm$^{-3}$.

* * * * *